United States Patent [19]

Adachi

[11] 4,139,821
[45] Feb. 13, 1979

[54] INNER MAGNET TYPE MOVABLE COIL INSTRUMENT WITH LINEAR SCALE

[76] Inventor: Kizo Adachi, 10-9, 3-chome, Negishi, Taito-ku, Tokyo, Japan

[21] Appl. No.: 782,029

[22] Filed: Mar. 28, 1977

[30] Foreign Application Priority Data

Mar. 29, 1976 [JP] Japan .................................. 51/33591

[51] Int. Cl.² .......................... G01R 5/06; G01R 1/16
[52] U.S. Cl. .................................. 324/151 A; 324/132
[58] Field of Search .................... 324/146, 147, 151 R, 324/151 A, 132; 335/222

[56] References Cited

U.S. PATENT DOCUMENTS

| | | | |
|---|---|---|---|
| 2,183,685 | 12/1939 | Lingg | 324/147 |
| 2,260,026 | 10/1941 | Hoare | 324/147 |
| 2,610,989 | 9/1952 | Wiese et al. | 324/147 |
| 2,940,045 | 6/1960 | Ammon | 324/151 A |
| 3,130,365 | 4/1964 | Minter | 324/132 X |
| 3,273,061 | 9/1966 | Rumpelein et al. | 324/151 R |
| 3,602,815 | 8/1971 | Rumpelein et al. | 324/151 A |
| 3,711,776 | 1/1973 | Inami et al. | 324/151 A |

*Primary Examiner*—Gerard R. Strecker
*Attorney, Agent, or Firm*—Flynn & Frishauf

[57] ABSTRACT

An inner magnet type movable coil instrument comprises a cylindrical permanent magnet magnetized to axis-symmetrically form a pair of opposite magnetic poles in a direction to the axis of the magnet; a pair of arcuate magnetic plates made of soft iron and bonded to the opposite side surfaces of the cylindrical permanent magnet with each magnetic pole located at a central line of the magnetic plate; a semicylindrical yoke made of soft iron and secured to one side surface on which it intersects orthogonal to the opposite magnetic poles, said yoke being arranged coaxial with the permanent magent and having sections inclined in the same direction to the axis of the yoke and confronting the magnetic poles of the permanent magnet; a movable coil rotatable coaxially of the permanent magnet and in a gap between the permanent magnet and the yoke; upper and lower bearing members formed integral with the yoke and journalizing the movable coil therein; control spring means mounted on the movable coil; and a pointer.

8 Claims, 21 Drawing Figures

INNER MAGNET TYPE MOVABLE COIL INSTRUMENT WITH LINEAR SCALE

This invention relates to an inner magnet type movable coil instrument having excellent linear electrical characteristics of an indicator deflection and thus a high-accuracy linear scale.

Figure 1:
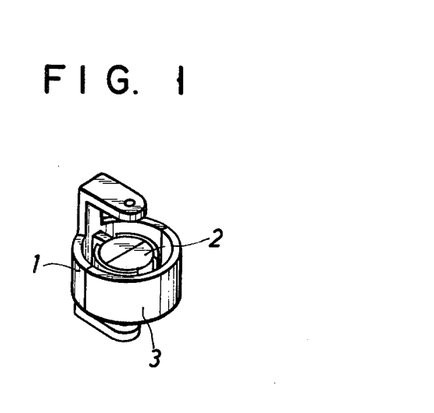
FIG. 1 is a perspective view showing a major part of a conventional inner magnet type movable coil type instrument.

In general, an inner magnet type instrument of the movable coil variety has the advantages of being relatively simple in construction, compact and low in cost, but it fails to provide a linear scale. Now consider for example, an instrument in which a movable coil is rotatably mounted around only a cylindrical permanent magnet. In this case, the deflection angle $\theta$ of the movable coil with respect to operating current can be expressed as the function of $\theta \cdot \csc\theta$, resulting in a nonlinear scale. Various attempts have been made to obtain an inner magnet type movable coil instrument having a linear scale. FIG. 1 shows an inner magnet type instrument by way of example. An inner permanent magnet 2 and movable coil, not shown, are mounted on a semicylindrical frame 1 and a semi-cylindrical yoke 3 is bonded at a predetermined position to the frame. In this case, the manufacturing steps are increased in number and no uniform magnetic flux density distribution is obtained in a moving range of the movable coil and in a gap defined between the inner permanent magnet 2, frame 1 and yoke 3, failing to provide a linear scale. Particularly when the yoke 3 is bonded to the frame 1, any slight non-uniform bond will result in a different gap flux density distribution with a great variation in the characteristics of the finished instruments. Thus, it is impossible to mass-produce instruments having uniform characteristics. The absence of the yoke 3 in FIG. 1 gives a reversed S-shape characteristic as indicated by a dot-dash line in FIG. 17, making it impossible to provide a linear scale.

It is accordingly the object of this invention to provide an inexpensive inner magnet type movable coil instrument which can be assembled without cumbersome operations and adjustments which is simple in component parts and suited for mass production and which easily provides a linear scale.

SUMMARY OF THE INVENTION

According to this invention there is provided an inner magnet type movable coil instrument comprising a cylindrical permanent magnet magnetized to axis-symmetrically form a pair of opposite magnetic poles in a direction to the axis of the magnet; a pair of arcuate magnetic plates made of soft iron and bonded to the opposite side surfaces of the cylindrical permanent magnet with each magnetic pole located at a central line of the magnetic plate; a semi-cylindrical yoke made of soft iron and secured to one side surface on which it interesects orthogonal to the opposite magnetic poles, said yoke being arranged coaxial with the permanent magnet and having sections inclined in the same direction to the axis of the yoke and confronting the magnetic poles of the permanent magnet; a movable coil rotatable coaxially of the permanent magnet and in a gap between the permanent magnet and the yoke; upper and lower bearing members formed integral with the yoke and journalizing the movable coil therein; control spring means mounted on the movable coil; and a pointer.

DETAILED DESCRIPTION

Figure 2:
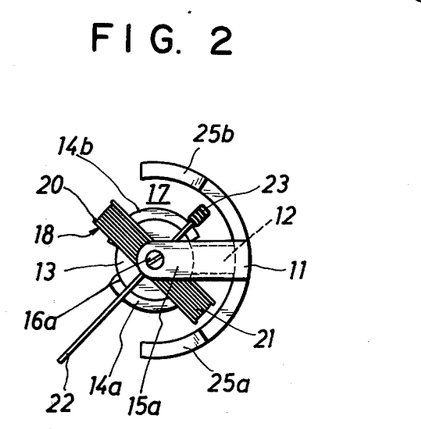
FIG. 2 is a plan view showing an inner magnet type movable coil instrument according to one embodiment of this invention.
Figure 3:
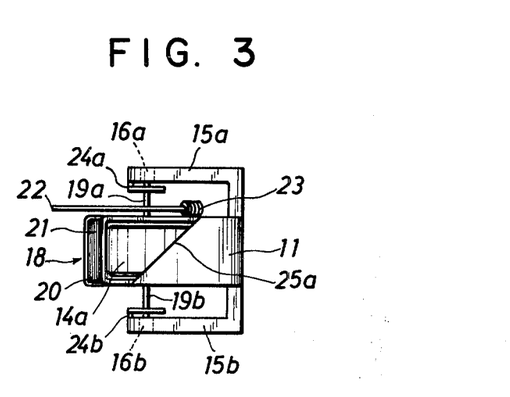
FIG. 3 is a side view of the instrument shown in FIG. 2.

In FIGS. 2 and 3 a support 12 is mounted on the substantially central inner wall of a semi-circular yoke frame 11 made of soft iron, and a cylindrical inner permanent magnet 13 is mounted coaxial with the frame 11 and on the forward end portion of the support 12. The inner magnet 13 is so magnetized that a pair of magnetic poles (N pole and S pole) are formed axis-symmetrically in a diametrical direction (in a vertical direction in FIG. 2) of the inner magnet 13. A pair of arcuate magnetic pole plates 14a, 14b made of soft iron are provided one at each of opposite side surfaces of the permanent magnet 13. A pair of L-shaped bearing plates 15a, 15b are integrally mounted one on the upper end of the yoke frame 11 and one on the lower end of the yoke frame 11. Bearing 16a and 16b are disposed in the forward end portions of the bearing plates 15a and 15b, respectively. Rotating shafts 19a and 19b are journaled in the bearings 16a and 16b, respectively, and rotatably support a movable coil 18 which is disposed in a gap formed between the yoke frame 11 and the inner permanent magnet 13. The movable coil 18 is obtained by winding a very fine enameled wire 21 on a form 20 made of, for example, aluminium. A pointer 22 is mounted on the rotating shaft 19a in a direction orthogonal to the movable coil 18 as shown in FIG. 2 and the rear end of the indicator 22 extends rearwardly. A balance weight 23 is provided, as necessary, on the rear end of the extension of the pointer 22. In order to return the movable coil 18 to an indicated portion a control spring 24a is located around the rotating shaft 19a on the side of the bearing plate 15a and a control spring 24b around the rotating shaft 19b on the side of the bearing plate 15b.

Figure 4:
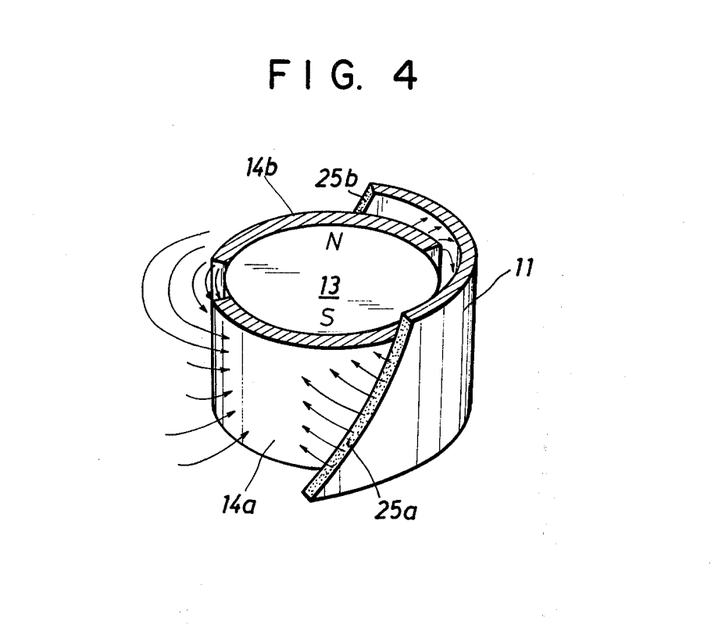
FIG. 4 is a perspective view, partially enlarged, of the instrument shown in FIGS. 2 and 3.
Figure 5:
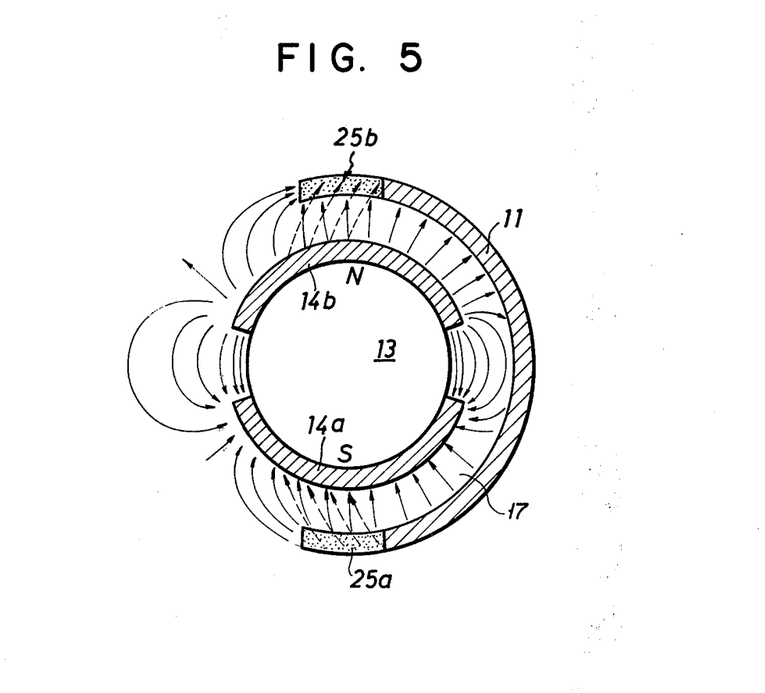
FIG. 5 is a plan view showing that portion of the instrument as shown in FIG. 4.

As shown in FIGS. 4 and 5 the free ends of the yoke frame 11 extend in a manner substantially to cover the S and N poles of the permanent magnet 13. The free ends of the yoke frame 11 are diagonally cut in the forward direction to provide diagonal cross-sections 25a and 25b. The distribution of magnetic flux in a gap between the yoke frame, inner permanent magnet 13, and the magnetic pole plates 14a and 14b is as follows. Most of the magnetic flux emerging from the side surface of the N-pole plate 14b enters into the yoke frame 11. The rest of the magnetic flux flows from both ends of the N-pole plate 14b toward both the ends of the S-pole plate 14a. The magnetic flux entered into the yoke frame 11 emerges from its side surface portion facing the S-pole plate 14a into the side surface portion of the S-pole plate 14a. A magnetic flux appearing from the cross-section 25a of the yoke 11 vertically enters into the S-pole plate 14a as shown in FIG. 4. Likewise, a magnetic flux vertically emerging from the surface of the N-pole plate 14b enters into the cross-section 25b of the yoke frame 11 as shown in FIG. 5.

The movable coil 18 is driven by a magnetic flux distributed in a gap between the yoke 11 and the inner permanent magnet 13 as shown in FIGS. 4 and 5 as well as by an electromagnetic force resulting from operating current. The movable coil 18 is also subjected to a magnetic flux present in the upper and lower surfaces of the inner permanent magnet 13. When, therefore, a relation between the value of operating current through the movable coil 18 and the rotation angle of the movable coil 18 is considered, it is necessary to consider the magnitude and distribution of the magnetic flux in the gap 17 as shown in FIG. 5 as well as the magnitude and distribution of the magnetic flux present in the upper and lower surfaces of the permanent magnet 13.

A relation of the operating current value to the rotation angle of the movable coil 18 will be considered from the viewpoint of the distribution of magnetic flux density cut by the movable coil 18.

Figure 6:
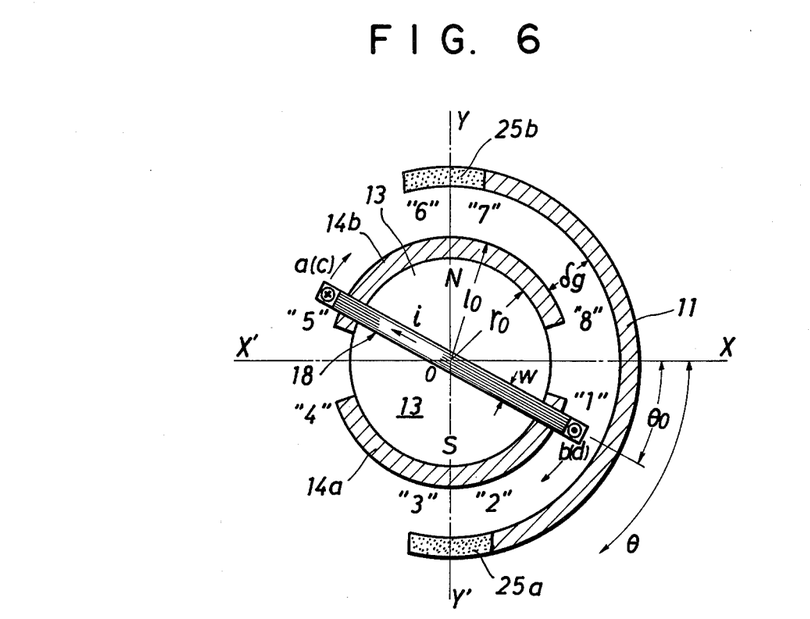
FIG. 6 is a plan view showing a fundamental portion of the instrument shown in FIGS. 2 and 3.
Figure 7:
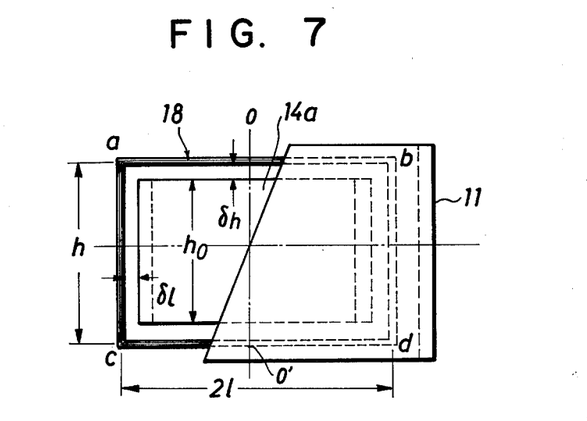
FIG. 7 is a side view of FIG. 6.

In FIGS. 6 and 7, the radius and height of the inner permanent magnet 13 are represented by $r_0$ and $h_0$, respectively, and the dimension of the gap 17 is represented by $\delta_g$. Suppose that the movable coil 18 has a rectangular configuration having a length of 2l and a height of h and that the vertical section of the coil 18 is located at the middle ($\delta_g/2$) of the gap 17. The movable coil 18 is so located that one of its vertical sections faces that end portion of the S-pole plate 14a as located within the gap 17 and the other vertical section faces that end portion of the N-pole plate 14b as located outside the gap. This position corresponds to a zero position on a scale to which the pointer is normally directed. This angular position is indicated by $\theta = \theta_0$ where $l > l_0$ and $h > h_0$.

If in FIG. 7 a gap between the top surface of the permanent magnet 13 and the movable coil 18 is set at a hight of $\delta_h$, a vertical component of a magnetic line of force cut by a length 2l of the coil 18, i.e., an effective flux density $B_l$ is determined by the rotation angle $\theta$ and position of the coil 18 in the longitudinal direction of the coil 18. In general, the effective flux density $B_l$ can be expressed as follows:

$$B_l = \phi(l, \theta)$$

Figure 8:
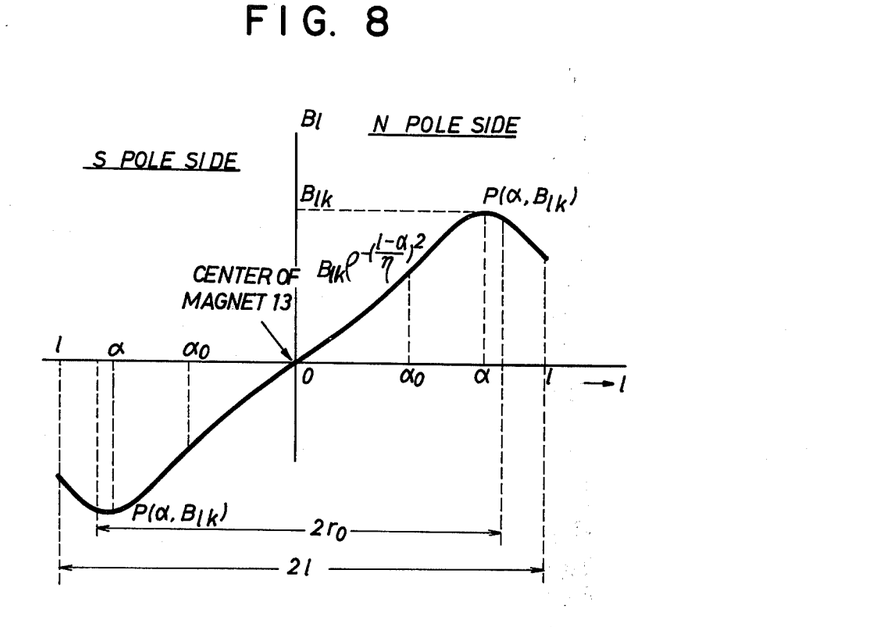
FIG. 8 is a graph showing a magnetic flux density distribution in the direction of a diameter of a magnetic surface.
Figure 9:
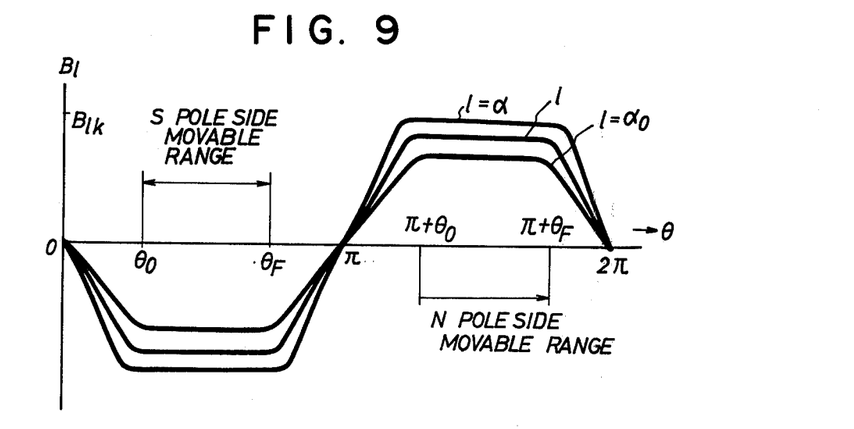
FIG. 9 is a graph showing a magnetic flux density distribution in the circumferential direction of the top (bottom) surface of a magnet.

The $B_l$—l characteristic can be expressed with the rotation angle $\theta$ as a parameter as shown in FIG. 8 and the $B_l - \theta$ characteristic can be expressed with the length l of the coil 18 as shown in FIG. 9. It is to be noted, however, that the rotation angle $\theta$ and length l of the coil 18 vary dependent upon the ratio ($r_0/h_0$) of the radius to the height and the state of magnetization of the magnet 13. If with the $B_l - \theta$ characteristic the maximum deflection angle of the coil 18 on the S-pole side is represented by $\theta_F$, the effective flux density $B_l$ at $\theta_0 \leq \theta \leq \theta_F$ becomes constant (on the N-pole side, the $B_l$ at $(\theta_0 + \pi) \leq \theta \leq (\theta_F + \pi)$ becomes constant) and the effective magnetic flux density can be approached, by the distribution function of Gauss, from the distribution characteristic of the $B_l$—l characteristic. That is, Equation (1) becomes $$B_l = B_{lk} e^{-(\frac{l-\alpha}{\eta})^2} \quad (2)$$

$B_{lk}$, $\alpha$ and $\eta$ are constants as determined by the configuration of the distribution curve. When direct current i flows through the coil 18 having turns n of in a direction as indicated by arrows in FIG. 6, an electromagnetic force $df_l$ acting on a line element idl can be expressed by $$df_l = nB_l idl = nB_{lk} ie^{-(\frac{l-\alpha}{\eta})^2} \cdot dl \quad (3)$$

In consequence, the electromagnetic forces $f_l$ on the coils $\overline{Oa}$ and $\overline{Ob}$ become $$f_l = nB_{lk} i \int_0^l e^{-(\frac{l-\alpha}{\eta})^2} dl \quad (4)$$

Since the electromagnetic forces are equal in magnitude but opposite in direction, they act on the coil 18 as a couple of forces. The above-explanation is restricted to the upper surface side of the permanent magnet 13. Since the same electromagnetic forces act on the bottom surface side of the coils 18 $\overline{O'c}$ and $\overline{O'd}$, a driving torque $T_l$ acting upon the coil of a width 2l can be expressed as $$\tau_l = 2(2lf_l) = 4lnB_{lk} i \int_0^l e^{-(\frac{l-\alpha}{\eta})^2} \cdot dl \quad (5)$$

The above explanation is directed to driving torques to which the moving coil 18 is subjected due to magnetic fluxes on the upper and lower surface sides of the permanent magnet 13. A relation of the effective magnetic flux density function to the torque on the side surface of the permanent magnet 13 will be considered below.

In FIG. 7 the distribution of the effective magnetic flux density at the gap $\delta_l = \delta_g/2$ between the coil 18 and the magnet 13 differs dependent upon the position of the rotation angle $\theta$. At a section "1" - "2" ("7" - "8") and section "3" - "4" ("5" - "6") as shown in FIG. 6 the effective magnetic flux density becomes substantially constant irrespective of $\theta$ except on the side of the ends 4 and 5. With $B_s$ and $B_u$ represented by the electromagnetic forces $f_s$ and $f_u$, respectively acting upon the side surface coil section h, the following approximations are obtained:

$$f_s = B_s hni$$
$$f_u = B_u hni \tag{6}$$

In this case, $B_s = B_{1\text{-}2} = B_{7\text{-}8}$, $B_u = B_{3\text{-}4} = B_{5\text{-}6}$, and $B_s > B_u$.

Figure 10:
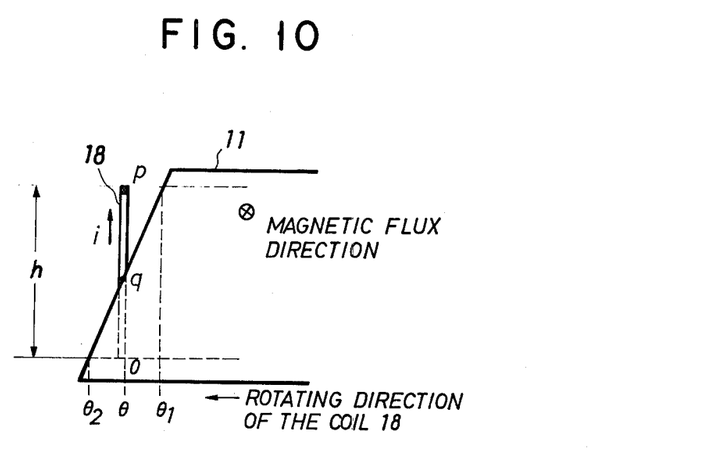
FIG. 10 is a graph for explaining the case where a movable coil is provided on a declined cutting section.

When at a section "2" to "3" the coil 18 of a height h is at the position ($\theta_1 \leq \theta \leq \theta_2$) as shown in FIG. 10, the partial lengths $\overline{Oq} = q$ and $\overline{qp} = P$ ($\overline{Oq} + \overline{qp} = h$) of the coil h are represented by the following equations:

$$\begin{cases} \overline{Oq} = q = h \dfrac{\theta_2 - \theta}{\theta_2 - \theta_1} \\ \overline{qp} = p = h \dfrac{\theta - \theta_1}{\theta_2 - \theta_1} \end{cases} \tag{7}$$

Let us now give consideration to the effective magnetic flux densities $B_{hq}$ and $B_{hp}$ at the partial lengths $\overline{Oq}$ and $\overline{qp}$ of the coil and the electromagnetic forces fq and fp. The $B_{hq}$ at the partial length $\overline{Oq}$ of the coil becomes substantially constant under the presence of the yoke frame 11 and becomes equal to the $B_s$. All the electromagnetic force fq acted upon the partial length $\overline{Oq}$ of the coil can be expressed as follows:

$$f_q = niB_{hq} \int_0^q dh = nhB_s \dfrac{\theta_2 - \theta}{\theta_2 - \theta_1} i \tag{8}$$

Figure 11:
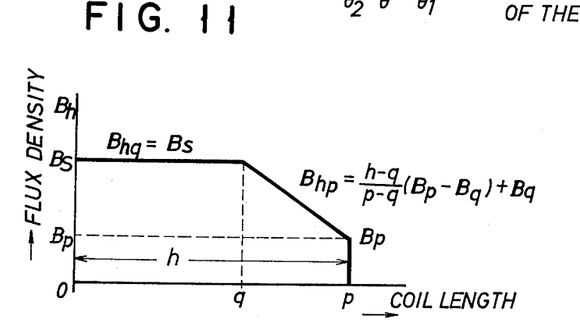
FIG. 11 is a graph for explaining a flux density distribution in the case of FIG. 1.

The effective magnetic flux density $B_{hp}$ at the partial section $\overline{qp}$ of the coil is Bq at a point q and since the gap through which the line of magnetic force is passed is elongated, the magnetic resistance is increased. That is, the $B_{hp}$ is the function of a distance $\overline{qp}$ and at substantially linearly decreased due to the geometric configuration of the inclined section (see FIG. 11) Now suppose that a value at a point p is expressed by $B_p$. Then, the $B_{hp}$ approximately becomes $$B_{hp} = \dfrac{h - q}{p - q}(B_p - B_q) + B_q \tag{9}$$

Figures 12, 13:
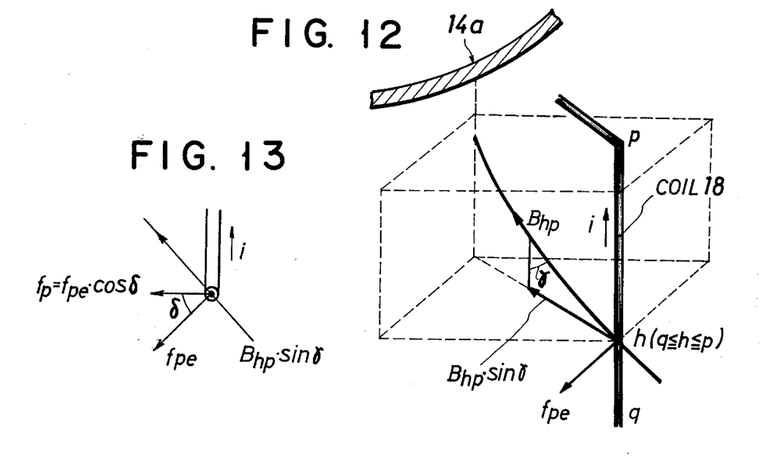
FIGS. 12 and 13 show the generation of driving torques to which a coil is subjected at the inclined cutting sections of a yoke.

The effective component of the magnetic flux cutting the coil 18 is expressed, as shown in FIG. 12, by $B_{hp}\sin\gamma$. The direction of an electromagnetic force $f_{pe}$ is vertical to a plane including i and $B_{hp}\sin\gamma$ as shown in FIG. 12 and its effective component can be expressed by $f_{pe}\cos\delta$.

All effective electromagnetic force $f_p$ acting upon a plane $\overline{qp}$ can be expressed as follows:

$$f_p = \int_q^p niB_{hp}\sin\gamma\cos\delta\, dh \tag{10}$$
$$= \tfrac{1}{2}(B_s + B_p)\dfrac{\theta - \theta_1}{\theta_2 - \theta_1} hni\sin\gamma\cos\delta$$

When the coil 18 is present at the section "2" to "3", all effective electromagnetic force $f_{hn}$ acting upon the coil length h can be expressed by a sum of equations (8) and (10)

$$f_{hn} = f_q + f_p = \{B_s \dfrac{\theta_2 - \theta}{\theta_2 - \theta_1} + \tag{11}$$
$$\tfrac{1}{2}(B_s + B_p)\dfrac{\theta - \theta_1}{\theta_2 - \theta_1}\sin\gamma\cos\delta\}hni.$$

Likewise, an electromagnetic force $f_{hs}$ acting upon the coil length h at the opposite section "6" to "7" can be found.

$$f_{hs} = \{B_s \dfrac{\theta - \theta_1}{\theta_2 - \theta_1} + \tfrac{1}{2}(B_s + B_p)\dfrac{\theta_2 - \theta}{\theta_2 - \theta_1}\sin\gamma\cos\delta\}hni \tag{12}$$

Since in this case the gap between the inclined cross-sections 25a and 25b has a magnetic symmetry, ratios of an increase and decrease of $f_{hn}$ and $f_{hs}$ to $\theta$ ($\theta_1 \leq \theta \leq \theta_2$), that is; $|df_{hn}/d\theta|$ and $|df_{hs}/d\theta|$ are equal to each other. As a result, $$f_{hn} + f_{hs} = f_s + f_u = \text{constant } (B_s + B_u = \text{constant}) \tag{13}$$

Figure 14A:
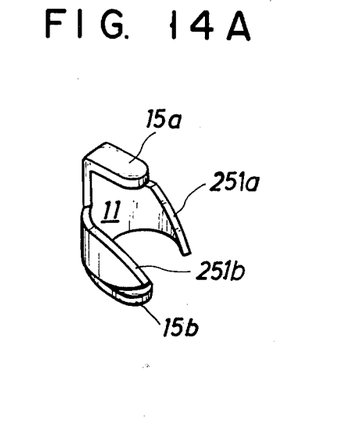
FIGS. 14A and 14B are perspective and side views, respectively, showing a modified form of inclined cutting sections of the yoke.
Figure 14B:
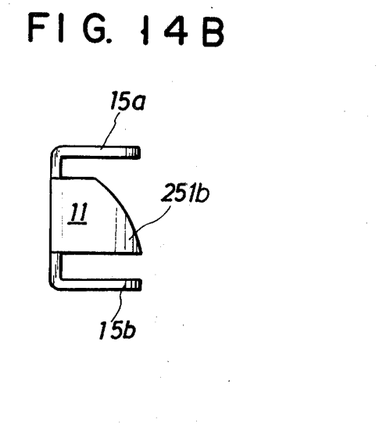
Figure 15A:
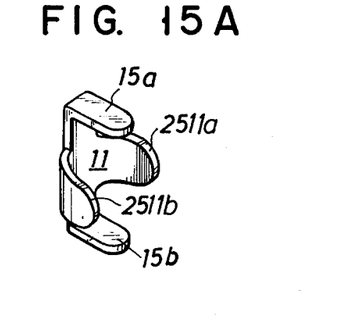
FIGS. 15A and 15B are perspective and side views, respectively, of another modified form of inclined cutting sections.
Figure 15B:
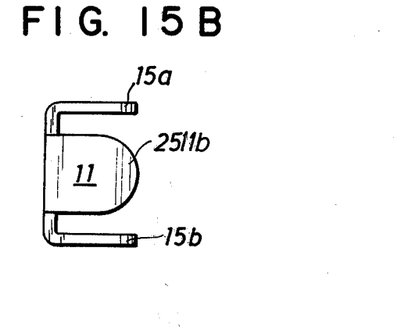

Even when the inclined cross-sections 25a and 25b of the yoke frame 11 have curvilinear configurations 251a and 251b as shown in FIGS. 14A and 14B or have concave configurations 2511a and 2511b as shown in FIGS. 15A and 15B, equation (13) is generally established as long as these configurations have geometrical (magnetical) symmetry.

Figure 16:
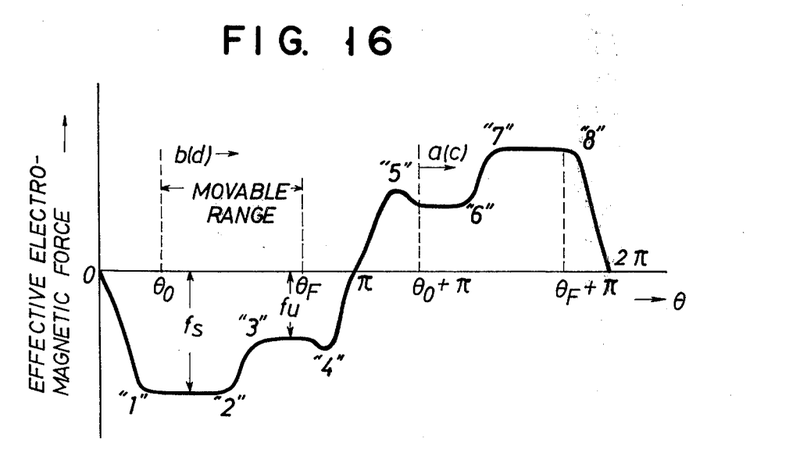
FIG. 16 is a graph showing an effective flux density distribution in a gap.

FIG. 16 shows the characteristic of an effective electromagnetic force with respect to $\theta$ ($0 \leq \theta \leq 2\pi$). A torque $\tau_h$ acting upon the coil length h at each section of one cycle can be expressed as follows:

$$\begin{aligned}\tau_h &= (\tau_{1\text{-}2} + \tau_{5\text{-}6}) = (\tau_{2\text{-}3} + \tau_{6\text{-}7}) \\ &= (\tau_{3\text{-}4} + \tau_{7\text{-}8}) = l(f_s + f_u) \\ &= hlni(B_s + B_u)\end{aligned} \tag{14}$$

As will be appreciated from the above, the electromagnetic force acts upon all the rectangular coil 18 of 2lxh and acts as a driving torque. All the driving torque $\tau$ is expressed as a sum of equations (5) and (14), i.e., $\tau = \tau_l + \tau_h$. With the spring constant of the control springs 24a and 24b represented by $\tau_c$, the currents i becomes $$i = \dfrac{\tau_c(\theta - \theta_o)}{\{h(B_s + B_u) + 4B_o\}ln} = G(\theta - \theta_o) \tag{15}$$

where $\theta_o$ represents a zero position, on the scale, of the coil 18 and $$\begin{cases} B_o = B_{lk} e^{-(\frac{l-\alpha}{\eta})^2} dl \\ G = \dfrac{\tau_c}{\{h(B_s + B_u) + 4B_o\}ln} \end{cases} \tag{16}$$

Thus, the current i can be expressed as a linear equation with respect to $\theta$ and the graduation on the scale becomes a linear graduation. A maximum deflection angle allowed in the instrument according to this invention can be determined by the holding mechanism of the magnet 13, coil width(w) - magnet diameter relation of the coil 18, yoke frame 11, arc-length of the magnetic plates 14a and 14b, and so on. An angle range 90° can be readily obtained and, in practice, a quasi-angle range of 90° or more can be provided.

The data of the instrument as manufactured according to this invention is as follows:

A magnet 13 made of Alnico 8 was used under the following requirements:

radius $r_o$: $5 \times 10^{-3}$ (m)
height ($h_o$): $8 \times 10^{-3}$ (m)
average dimension lxh: $7.3 \times 10^{-3}$ (m) $\times$ $10.2 \times 10^{-3}$ (m)
coil turns n: 720
coil resistance: 1.093 K-Ohm
$a$: $4.9 \times 10^{-3}$ (m)
$\eta$: $2.68 \times 10^{-3}$ (m)
$\theta_o$: 45°
$B_{lk}$: 0.0818 Wb/m$^2$
$B_s$: 0.15 Wb/m$^2$
$B_u$: 0.055 Wb/m$^2$
$\tau_c$: $2.83 \times 10^{-6}$ (N-m)

As a result, the current i becomes equal to $$i = 0.147 \times 10^{-3} (\theta - 45°) \quad (17)$$

Figure 17:
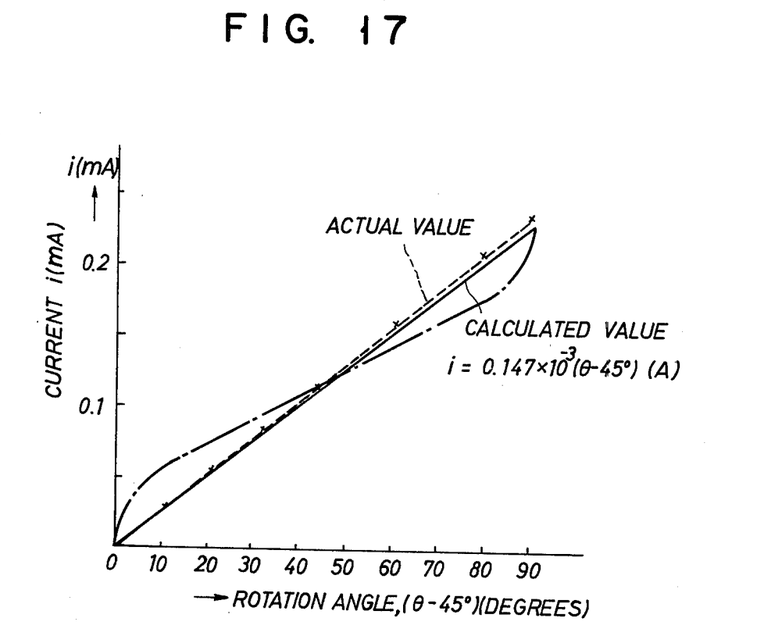
FIG. 17 is a graph showing a relation of operating current to a rotation angle.

When the deflection angle is in a range of $0 \leq (\theta - 45°) \leq 90°$ a calculated value is as shown in equation (17) and the found results are as shown in FIG. 17. A very small deviation from the linearity of equation (17) is observed at the actual value and a maximum error was found to be about 1.5%. The linearity improvement was marked as compared with the conventional various inner magnetic type instruments of the movable coil type. In consequence, the instrument according to this invention has a linear scale and can quantitively measure a DC current and DC voltage, like an external magnetic type instrument, when considered from the standpoint of performance. When considered from the standpoint of manufacture and construction, there are also retained the advantages of the inner magnet type instrument of movable coil variety, i.e., the advantages of being simple in construction, compact, light in weight, low in cost, etc.

Figure 18:
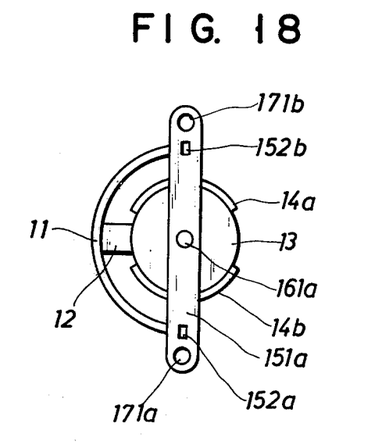
FIGS. 18 and 19 are a plan view and side view, respectively, showing an instrument according to another embodiment of this invention.
Figure 19:
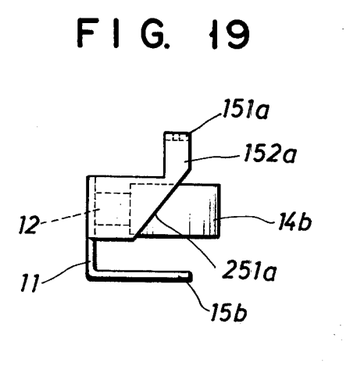

In the embodiment shows in FIGS. 2 and 3, the L-shaped bearing plates 15a and 15b extend from substantially the middle of the yoke frame 11 as measured from the upper and lower ends of the yoke 11 (FIG. 2). In an embodiment shown in FIGS. 18 and 19, bearing support plates 152a and 152b are provided above both side ends, respectively, of the yoke frame 11 and a straight bearing plate 151a can be mounted, by caulking for example, on the upper ends of the bearing support plates 152a and 152b. A bearing 161a is provided at the middle of the bearing plate 151a and a pair of casing mounting holes 171a and 171b are formed one at each end portion of the bearing plate 151a. By so doing, an instrument body can be readily mounted on a casing. Although in the embodiment shown in FIGS. 2 and 3 the inclined cutting sections of the yoke frame 11 is formed by making the length of the upper end of the yoke frame short and the length of the lower end of the yoke frame longer as shown in FIG. 3, they can be formed by making the length of the upper end of the yoke frame long and the length of the lower end of the yoke frame short as shown in FIG. 19.

As will be appreciated from the above, the feature of this invention resides in that the forward ends of the yoke frame disposed opposite to, and outside of, the inner magnet are made inclined. The instrument according to this invention, therefore, has the following features and finds a wide application as a practical DC meter.

(a) The instrument has markedly improved linearity and a performance amounting to substantially a 1.5 grade under the JIS (Japanese Industrial Standard).

(b) The inclined cutting sections of the yoke frame are fundamentally linearly inclined owing to the linearity characteristic. However, they may be made curvilinear so long as they constitute a geometrical/magnetical symmetry.

(c) As a maximum deflection angle of the pointer, a quasi-angle range of 90° or more is obtained without impairing linearity.

(d) The instrument is compact, small in size and has fewer parts.

(e) Easy machining operations, as well as easy assembly, are assured.

(f) Upon assembly, no cumbersome adjustment is required and nevertheless excellent performance is assured. The assembly cost can be reduced to a great extent. This invention is very well suited for mass production.

What is claimed is:

1. An inner magnet type movable coil instrument having a substantially linear scale, comprising:

a cylindrical permanent magnet magnetized to axis-symmetrically form a pair of opposite magnetic poles which extend in the direction of the axis of the cylindrical permanent magnet;

a pair of arcuate magnetic plates made of soft iron and bonded to respective peripheral surface portions of the cylindrical permanent magnet, each magnetic pole of the cylindrical permanent magnet being located substantially at a central line of a respective magnetic plate;

a semi-cylindrical yoke made of soft iron and secured to a portion of the peripheral surface of the cylindrical permanent magnet which is orthogonal to said opposite magnetic poles, a gap being provided between the cylindrical permanent magnet and the yoke, said yoke being arranged coaxial with the cylindrical permanent magnet and having first and second inclined end sections which confront the magnetic poles of the cylindrical permanent magnet with a gap therebetween;

a movable coil rotatable coaxially of the cylindrical permanent magnet and in said gap between the cylindrical permanent magnet and the yoke, the rotating area of the movable coil including the confronting gap between the first and second inclined end sections of the yoke and the magnetic poles of the cylindrical permanent magnet, the coil passing through said confronting gaps at an intermediate portion of its rotation relative to the yoke and cylindrical permanent magnet and movable over its path of rotation in a substantially linear manner;

upper and lower bearing members formed integrally with the yoke and in which the movable coil is journalled;

control spring means mounted on the movable coil; and a pointer coupled to the movable coil to indicate its position.

2. An inner magnet type movable coil instrument according to claim 1, in which said inclined sections of said yoke have a straight profile.

3. An inner magnet type movable coil instrument according to claim 1, in which said inclined sections of said yoke have a curvilinear profile.

4. An inner magnet type movable coil instrument according to claim 3, in which said inclined sections of said yoke have a convex profile.

5. An inner magnet type movable coil instrument according to claim 1, in which said upper and lower bearing members comprise L shaped bearing plates extending from substantially central upper and lower ends of the yoke.

6. An inner magnet type movable coil instrument according to claim 1, in which said upper bearing member comprises first and second bearing support plates extending upwardly from both sides of the yoke, and a bearing plate supported on and between said first and second bearing support plates and having a casing mounting hole.

7. An inner magnet type movable coil instrument according to claim 1, in which said movable coil has a balance weight thereon.

8. An inner magnet type movable coil instrument according to claim 1 wherein said yoke is a single semi-cylindrical member.

* * * * *

UNITED STATES PATENT AND TRADEMARK OFFICE
CERTIFICATE OF CORRECTION

PATENT NO. : 4,139,821
DATED : February 13, 1979
INVENTOR(S) : Kizo ADACHI

It is certified that error appears in the above-identified patent and that said Letters Patent are hereby corrected as shown below:

Column 3, line 66, change "hight" to --height--.

Column 4, line 28, change "having turns n" to

-- having n turns --.

Signed and Sealed this

Tenth Day of July 1979

[SEAL]

Attest:

Attesting Officer

LUTRELLE F. PARKER
Acting Commissioner of Patents and Trademarks